(12) United States Patent
Frutschy et al.

(10) Patent No.: US 7,288,472 B2
(45) Date of Patent: Oct. 30, 2007

(54) METHOD AND SYSTEM FOR PERFORMING DIE ATTACH USING A FLAME

(75) Inventors: Kris J. Frutschy, Phoenix, AZ (US); Sudarshan V. Rangaraj, Chandler, AZ (US); Tom M. Lappin, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/020,433

(22) Filed: Dec. 21, 2004

(65) Prior Publication Data

US 2006/0134830 A1 Jun. 22, 2006

(51) Int. Cl.
*H01L 21/44* (2006.01)

(52) U.S. Cl. .................... 438/615; 438/632

(58) Field of Classification Search ............ 438/613, 438/615, 632, 646, 698, 760, 540, 614
See application file for complete search history.

(56) References Cited

U.S. PATENT DOCUMENTS

| | | | | |
|---|---|---|---|---|
| 3,614,832 A * | 10/1971 | Chance et al. | ............. | 29/831 |
| 3,735,911 A * | 5/1973 | Ward | ............. | 228/19 |
| 3,836,745 A | 9/1974 | Costello et al. | | |
| 4,017,963 A * | 4/1977 | Beyerlein | ............. | 29/827 |
| 4,278,867 A * | 7/1981 | Tan | ............. | 219/121.64 |
| 4,506,139 A * | 3/1985 | Daughton | ............. | 219/209 |
| 4,582,975 A * | 4/1986 | Daughton | ............. | 219/209 |
| 5,532,457 A * | 7/1996 | Cobb et al. | ............. | 219/411 |
| 5,648,005 A * | 7/1997 | Cobb et al. | ............. | 219/411 |
| 6,288,376 B1 * | 9/2001 | Tsumura | ............. | 219/635 |
| 6,384,366 B1 * | 5/2002 | Wong | ............. | 219/85.12 |
| 6,442,234 B1 * | 8/2002 | Morken et al. | ............. | 378/58 |
| 6,496,559 B1 * | 12/2002 | Morken | ............. | 378/58 |
| 6,861,278 B2 * | 3/2005 | Quinones et al. | ............. | 438/51 |
| 2002/0142517 A1 * | 10/2002 | Maeda et al. | ............. | 438/108 |
| 2003/0178474 A1 * | 9/2003 | Jiang et al. | ............. | 228/205 |
| 2004/0152238 A1 * | 8/2004 | Maeda et al. | ............. | 438/108 |
| 2005/0142695 A1 * | 6/2005 | Frutschy | ............. | 438/109 |

FOREIGN PATENT DOCUMENTS

| | | |
|---|---|---|
| DE | 27 14 483 A1 | 10/1978 |
| EP | 0 691 678 A2 | 1/1996 |
| EP | 0 918 354 A2 | 5/1999 |
| JP | 57 007145 A | 1/1982 |
| JP | 1-217935 * | 8/1988 |

OTHER PUBLICATIONS

IBM Disclosure Bulletin, "Applying Radiant Heat to Semiconductor Integrated Circuits", Mar. 1, 1978, pp. 3908-3909.*
IBM Disclosure Bulletin, Bonding and Rework System, Aug. 1978, pp. 949-949.*

(Continued)

*Primary Examiner*—S. V. Clark

(57) ABSTRACT

Embodiments of a method for attaching a die to a substrate using a flame or other heat source are disclosed. The flame may be produced by combustible gas. Also disclosed are embodiments of a system for performing die attach using a flame. Other embodiments are described and claimed.

39 Claims, 4 Drawing Sheets

OTHER PUBLICATIONS

"Small Copper Block Application for Solder Bump", IBM Disclosure Bulletin, Aug. 1991, vol. 34, Issue 3 pp. 52-53, Aug. 1, 1991.*

"Applying Radiant Heat To Semiconductor", IBM Technical Disclosure, vol. 20, Issue 10, pp. 3098-3909, Mar. 1, 1978.*

"Bonding and Rework System", IBM Technical Disclosure Bulletin, vol. 21, Issue 3, pp. 948-949, Aug. 1, 1978.*

"Chip Joining Method and Apparatus ro Flexible Modules", IBM Technical Disclosure Bulletin, vol. 32, Issue 3A, pp. 453-455, Aug. 1, 1989.*

"Solder Reflow Tool", IBM Technical Disclosure Bulletin, vol. 11, Issue 10, p. 1298, Mar. 1, 1969.*

U.S. Appl. No. 10/748,344, pending, Dec. 29, 2003, to Kris Frutschy, not yet published.

U.S. Appl. No. 10/947,515, pending, Sep. 22, 2004, to Kris Frutschy, not yet published.

K. J. Frutschy et al., "Rapid Die Heating for Low-Stress Die Attach", Intel Corporation White Paper, Mar. 9, 2004, 11 pages.

PCT Search Report dated Sep. 4, 2006.

* cited by examiner

METHOD AND SYSTEM FOR PERFORMING DIE ATTACH USING A FLAME

FIELD OF THE INVENTION

The disclosed embodiments relate generally to the packaging of semiconductor devices and, more particularly, to a method and system for attaching a die to a substrate using a flame or other heat source.

BACKGROUND OF THE INVENTION

An integrated circuit (IC) die may be attached, both mechanically and electrically, to a package substrate. The IC die may have an array of bond pads on the die's "front" side, and a solder bump or other lead may be affixed to each of these bond pads. A mating array of lands is disposed on the package substrate, and the die is placed face down on the substrate such that the array of solder bumps extending from the die are aligned with the mating array of lands on the substrate. The solder bumps extending from the IC die are then coupled to their respective lands on the substrate. The package substrate may include multiple layers of conductors (e.g., traces), and these conductors can route electrical signals (running to and from the die) to locations on the package substrate where electrical connections can be established with a next-level component (e.g., a motherboard, a computer system, a circuit board, another IC device, etc.). For example, the substrate circuitry may route all signal lines to a ball-grid array (or, alternatively, a pin-grid array) formed on a lower surface of the package substrate, and this ball- or pin-grid array then electrically couples the packaged IC die to the next-level component, which includes a mating array of terminals (e.g., lands, pin sockets, etc.). The use of an array of solder bumps (or columns, etc.) to couple an IC die to a substrate is often referred to as Controlled Collapse Chip Connect (or C4).

As noted above, an array of solder bumps extends from the front side of the IC die—each of these solder bumps being coupled with a bond pad on the die—and these solder bumps are coupled with a mating array of lands on the package substrate. To couple these solder bumps to the mating array of substrate lands, the assembly (e.g., die and substrate) may be placed in an oven and heated to reflow the solder bumps. For lead-based solder compositions, the reflow temperature may be approximately 225 degrees Celsius, and for lead-free solder compositions the reflow temperature may be approximately 260 degrees Celsius. Upon solidification of the solder bumps, an electrical and mechanical bond is formed between the solder bumps and their mating lands on the package substrate.

During solder reflow, both the die and substrate may be heated to the reflow temperature, which can lead to thermal expansion of these components. However, the coefficient of thermal expansion (CTE) of the IC die may be substantially different than the CTE of the package substrate. For example, a die made of silicon will have a CTE of approximately 3 ppm/° C., whereas an organic substrate may have a CTE of approximately 16 ppm/° C. Upon cool down after reflow, the reflowed solder bumps solidify to form solid interconnects between the die and substrate. At the same time, due to the difference in CTE between the IC die and package substrate, a differential thermal displacement occurs between the die and substrate. Because of this differential thermal displacement, as well as the mechanical stiffness of the solid interconnects that are formed, significant residual stresses may develop. These residual stress may impact both the IC die (e.g., the die's interconnect structure) and the package substrate, as well as the solder interconnects extending between these two components. These residual stresses may, for example, result in die warpage as well as cracking of the die's interconnect structure. The IC die's interconnect structure may be formed from a low-k dielectric material—which generally has lower mechanical strength in comparison to materials having a higher dielectric constant—and an interconnect structure formed from these low-k dielectric materials may be especially sensitive to cracking as a result of the above-described differential thermal displacement.

DETAILED DESCRIPTION OF THE INVENTION

Figure 1:
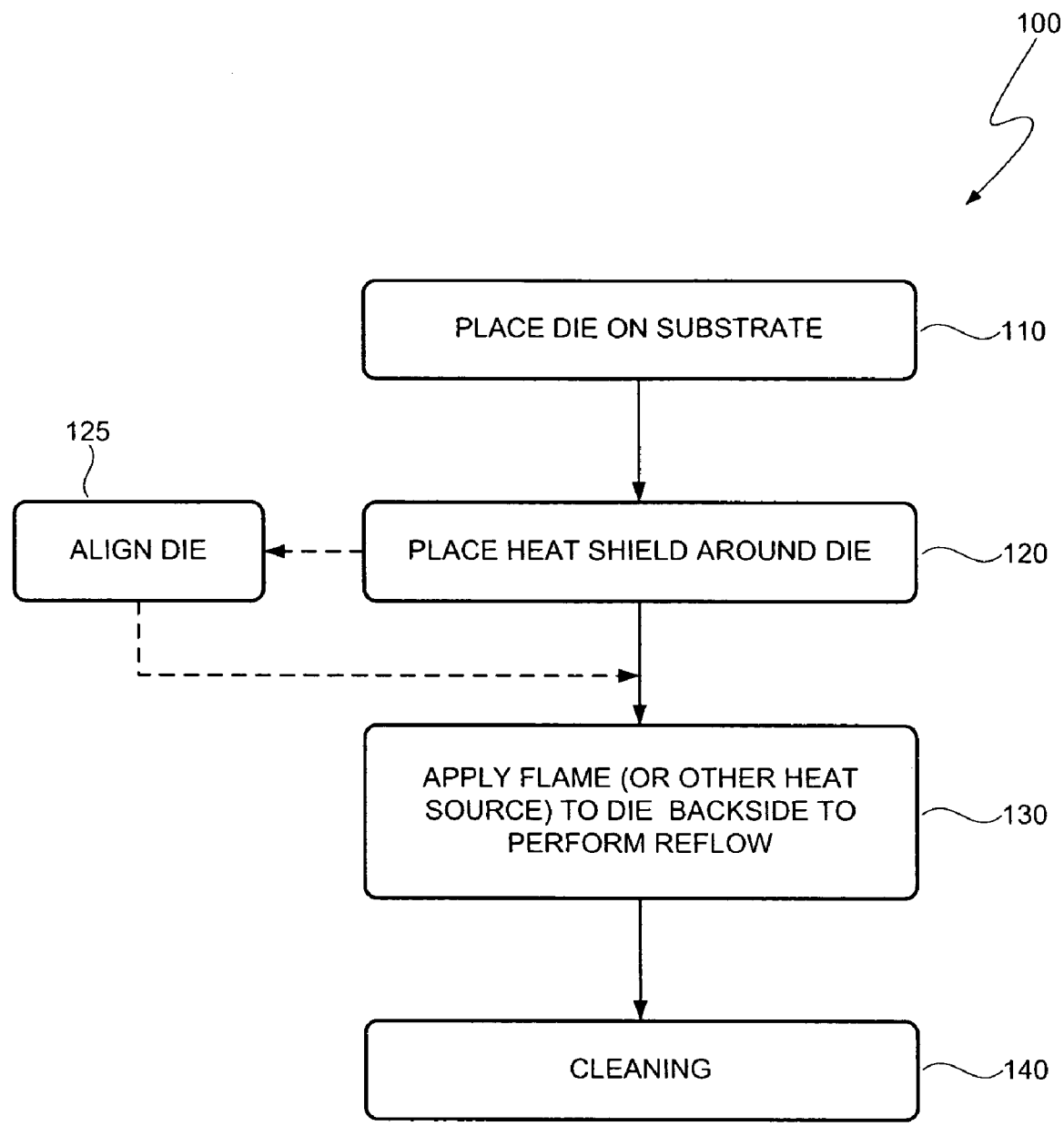
FIG. 1 is a schematic diagram illustrating an embodiment of a method of attaching a die to a substrate using a flame or other heat source.

Illustrated in FIG. 1 is an embodiment of a method 100 of attaching an integrated circuit (IC) die to a substrate using a flame or other heat source. Embodiments of the method 100 of FIG. 1 are further illustrated in FIGS. 2A through 2E, and reference should be made to these figures as called out in the text below.

Figure 2A:
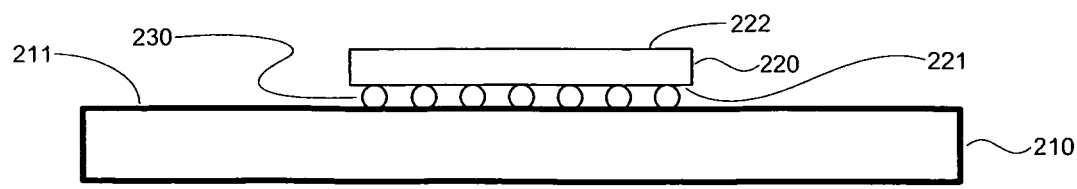
FIGS. 2A-2E are schematic diagrams illustrating further embodiments of the method shown in FIG. 1.

Referring to block 110 in FIG. 1, an IC die is placed on a substrate. This is illustrated in FIG. 2A, which shows a die 220 that has been placed on a substrate 210. Substrate 210 may comprise a package substrate or other die carrier, a circuit board, or any other suitable board or substrate. In one embodiment, the substrate 210 comprises a multilayer substrate including a number of alternating layers of metallization and dielectric material. Each layer of metallization comprises a number of conductors (e.g., traces), and these conductors may comprise any suitable conductive material, such as copper. Further, each metal layer is separated from adjacent metal layers by the dielectric layers, and adjacent metal layers may be electrically interconnected by conductive vias. The dielectric layers may comprise any suitable insulating material—e.g., polymers, including both thermoplastic and thermosetting resins or epoxies, ceramics, etc.—and the alternating layers of metal and dielectric material may be built-up over a core layer of a dielectric material.

The die 220 may comprise any type of integrated circuit device. In one embodiment, the die 220 comprises a microprocessor, a network processor, an application specific integrated circuit (ASIC), a field programmable gate array (FPGA), or other processing system or device. It should, however, be understood that the disclosed embodiments are not limited to the aforementioned processing devices and, further, that the die 220 may comprise any other type of device (e.g., a wireless communication device, a chip set, a memory device, etc.).

Die 220 includes a "front" side 221 and an opposing "back" side 222. As the reader will appreciate, the labels "front" side and "back" side are arbitrary, and the opposing surfaces 221, 222 of die 220 may be referenced by any other suitable terminology or nomenclature. The die 220 may, in one embodiment, have a layer of metal (or other material) disposed on the back side 222. However, in another embodiment the die back side 222 has no back side metallization. For example, the back side surface may be in the "as is" condition after IC fabrication (e.g., a polished surface).

According to one embodiment, an array of conductive bumps 230 or other conductive leads extends from the front side 221 of die 220, each of the conductive bumps being electrically connected to a bond pad (not shown in figures) on the die. In one embodiment, the conductive bumps 230 comprise solder; however, in other embodiments the conductive bumps may comprise other materials (e.g., copper, aluminum, etc.). The array of conductive bumps 230 mates with a corresponding array of conductive lands (not shown in figures) formed on an upper surface 211 of the substrate 210. When the conductive bumps 230 are connected with their respective lands on substrate 210 (e.g., by a reflow process, as described below), electrical communication can be established between the die and substrate. It should be noted that, in other embodiments, an array of conductive bumps (or other leads) may extend from the substrate 210, and this array of leads mates with a corresponding array of bond pads on the die.

Figure 2B:
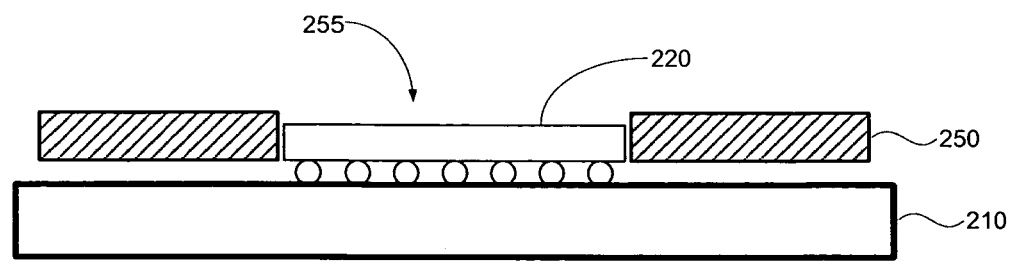
Figure 2C:
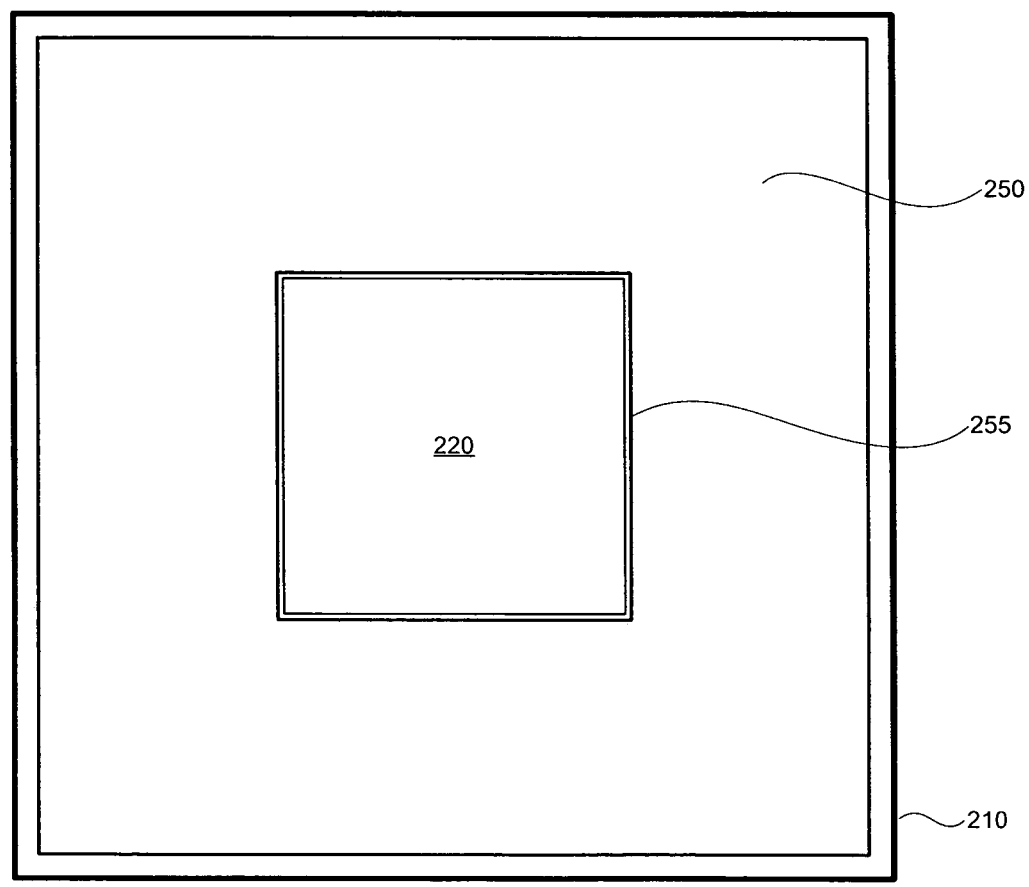

With reference to block 120 in FIG. 1, in one embodiment, a heat shield is placed over and/or around the die. This is illustrated in FIGS. 2B and 2C, which shows a heat shield 250 that has been disposed around the die 220. According to one embodiment, as shown in the figures, the heat shield 250 comprises a rectangular-shaped plate having an aperture 255 that is sized and oriented to receive the die 220. As will be described below, the back side 222 of die 220 will be subjected to a flame (or other heat source) during a die-attach process, and the heat shield may, in one embodiment, minimize heat transfer to the underlying substrate 210. Thus, the heat shield 250 may function to reduce thermal expansion of the substrate 210—and, accordingly, differential thermal expansion between the die 220 and the substrate—as well as to protect the substrate 210 from excessive heat and/or heat-induced damage (e.g., charring, etc.). In yet another embodiment, as set forth in block 125, the aperture 255 in heat shield 250 functions to align the die 220 relative to substrate 210. Heat shield 250 may comprise any suitable material (or combination of materials), such as copper, aluminum, stainless steel, or a ceramic material. It should be understood that the heat shield 250 shown in the figures is but one embodiment of such a device and, further, that the heat shield may comprise any suitable device, may be of any suitable shape or configuration, and may be constructed from any suitable materials or combination of materials.

Figure 2D:
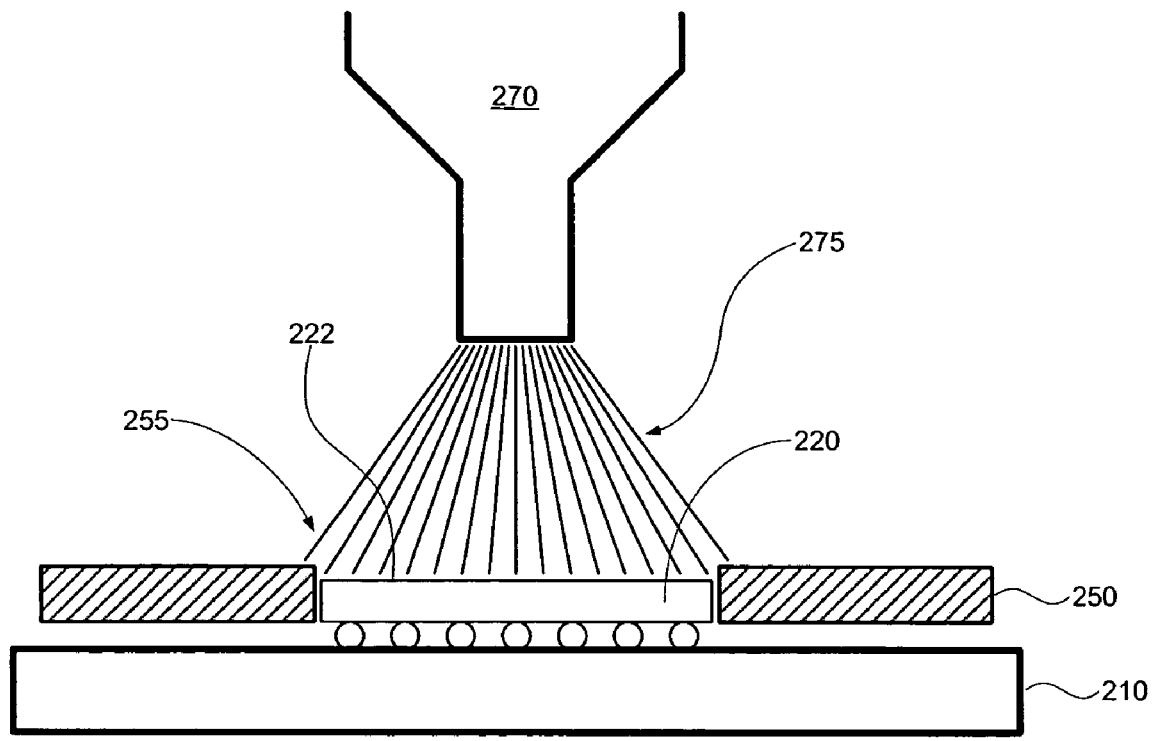

Referring now to block 130 in FIG. 1, a flame or other heat source is applied to the back side of the die to initiate reflow or bonding of the die leads (and/or reflow or bonding of leads extending from the package substrate). This is illustrated in FIG. 2D, where a flame 275 originating from a source 270 is applied to the back side 222 of die 220. The flame 275 may, in one embodiment, extend down to the die back side 222. In another embodiment, the flame 275 is in close proximity to the die back side 222. According to one embodiment, the flame encompasses substantially all of the die back side 222, whereas in a further embodiment the flame encompasses a portion of the die back side 222 and/or is targeted at a specific region of the die back side. In one embodiment, the flame is directed at the die 220, and a substantial portion of the heat shield is not directly subjected to the flame (although portions of the heat shield proximate the aperture 255 may be directly subjected to the flame 275), which may result in localized heating of the die. In other embodiments, however, the flame 275 may extend down to and over a substantial portion of the heat shield 250.

The flame 275 may be produced by any suitable source 270. For example, the flame may be produced by combustion of acetylene, butane, propane, MAPP (methylacetylene propadiene), or other combustible gas. However, in other embodiments, the flame is produced by a combustible liquid (e.g., kerosene) or a combustible solid material. It should also be understood that the disclosed embodiments are not limited to a heat source that produces a flame. For example, in other embodiments, the heat source may comprise super heated air, plasma, or steam.

In one embodiment, the flame 275 (or other heat source) should heat the die 220 to a temperature sufficient to initiate reflow of the solder bumps 230 (or, more generally, to initiate bonding of the die leads to the substrate). According to one embodiment, as a result of heating by flame 275, the temperature at the die front side 221 reaches approximately 225 degrees Celsius, or greater. In a further embodiment, the temperature at the die front side 221 does not exceed approximately 415 degrees Celsius during reflow.

Figure 3:
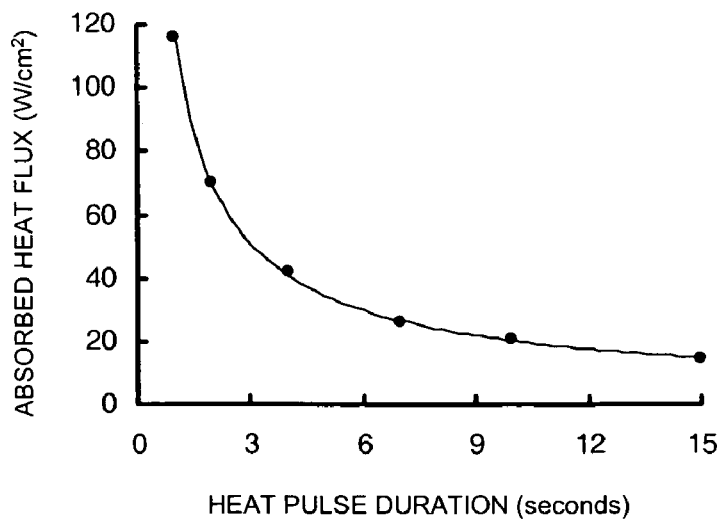
FIG. 3 is a graph showing one embodiment of the relationship between absorbed heat flux and pulse duration.

As noted above, the flame 275 (or, more generally, the supplied energy) may be localized at the die 220, which can help to minimize heat transfer to the substrate 210 (and heat shield 250). Heat transfer to, and heating of, the substrate 210 can also be reduced by minimizing the duration of the applied flame (or other energy pulse). Referring to FIG. 3, illustrated is an exemplary embodiment of a relationship between absorbed heat flux (at the die back surface 222) and heat pulse duration. As can be observed from this graph, as the pulse duration decreases, the absorbed heat flux needed at the die surface will increase. However, although the absorbed heat flux increases, heat transfer to the substrate is still minimized due to the short pulse duration. In one embodiment, the flame 275 is applied for a pulse duration of approximately 2 seconds, or less. In another embodiment, the absorbed heat flux at the die back side 222 is approximately 40 W/cm$^2$, or greater. In a further embodiment, the absorbed heat flux (and incident heat flux) spatially varies across the die back surface 222. For example, the absorbed heat flux may be greatest proximate the die's periphery and decrease toward the center of the die. It should be noted that the thermal efficiency of heat transfer from the flame to the die will likely not achieve 100 percent—and, in practice, may be much less than 100 percent—and the incident heat flux needed at the die back surface 222 may be significantly greater than the absorbed heat flux. Also, as the reader will appreciate, the absorbed heat flux and pulse duration will be dependent upon the die material, die thickness, and die size, as well as other factors, and the actual values of these and other parameters will vary on a case-by-case basis. Thus, no unnecessary limitations should be drawn from FIG. 3 and the examples set forth above.

According to one embodiment, while the die 220 is heated to a temperature sufficient to initiate reflow or bonding, the substrate 210 is not substantially heated (and/or only minimal portions of the substrate 210 are substantially heated). Reduced heating of the substrate 210 results, at least in part, from the use of heat shield 250, from the localized heating of the die 220, and/or from the rapid heating (e.g., short pulse duration) of the die. Because the substrate 210 is not substantially heated, the thermal expansion of this component during die attach is significantly reduced (or, perhaps, eliminated). Thus, the residual stresses—and the resultant damage, such as die cracking or warpage—that can be caused by differential thermal displacement between the die and substrate is minimized.

Figure 2E:
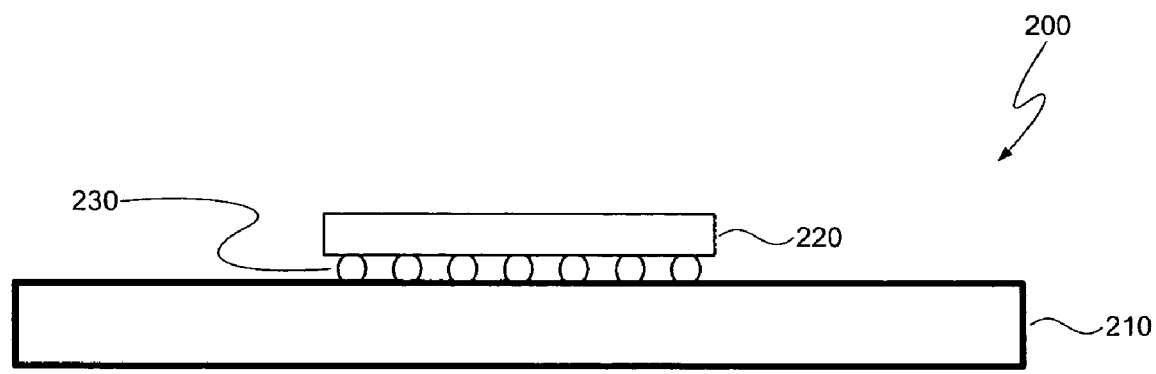

After reflow and solidification of the solder bump leads 230 (or, more generally, after bonding of the die leads to the substrate), the die 220 is both mechanically and electrically attached to the substrate 210. This is illustrated in FIG. 2E, which shows an assembly 200 including the die 220 and substrate 210, wherein the reflowed solder bumps 230 now form solid interconnects between the die and substrate. In one embodiment, because the differential thermal displacement between the die and substrate is minimized—and, hence, the resultant residual stresses reduced—no underfill material is disposed between the die and substrate. However, in other embodiments, an underfill material (not shown in figures) may be disposed between the die 220 and substrate 210.

Referring again to FIG. 1, and block 140 in particular, a cleaning process may be performed. The flame attach process may produce by-products, such as oxides and/or carbon- or hydrocarbon-containing substances, and a cleaning process may be employed to remove these by-products. Any suitable cleaning process or cleaning solutions may be used to clean the assembly 200. In one embodiment, the assembly 200 may be cleaned by rinsing the assembly using—or by immersing the assembly in—a solvent or flux. For example, the by-products of the flame attach process may be cleaned using a solution including alcohol, acetone, or water. Also, in some embodiments, a cool down period may be needed prior to cleaning.

Figure 4:
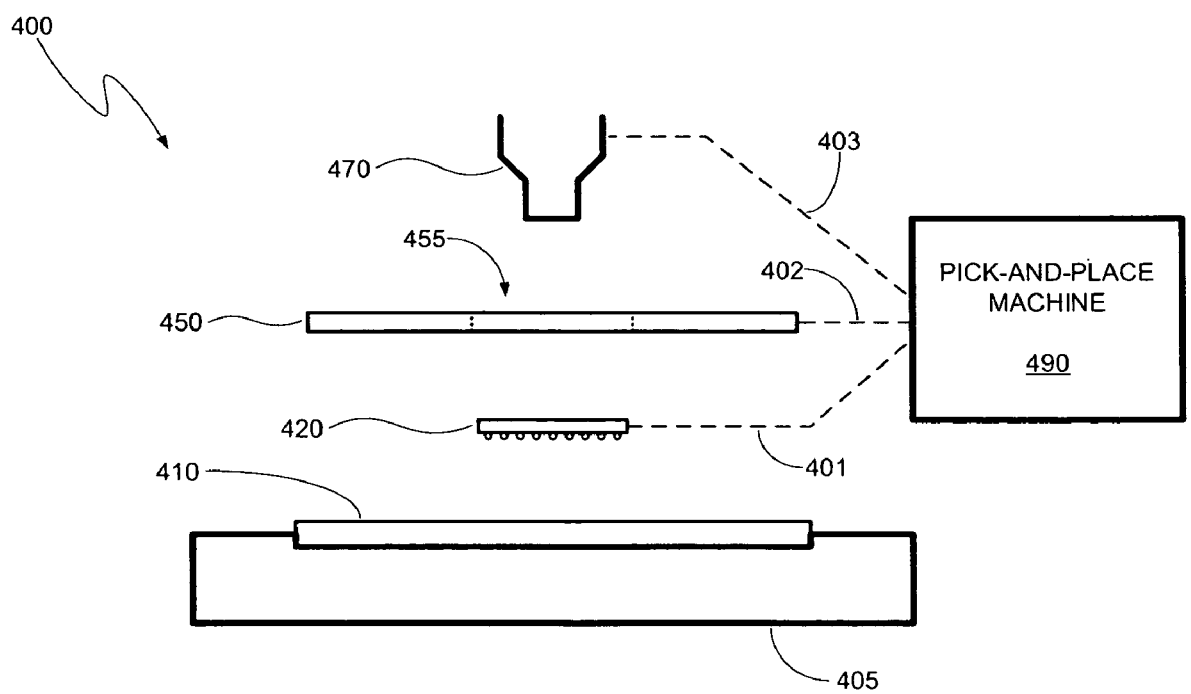
FIG. 4 is a schematic diagram illustrating one embodiment of a system for attaching a die to a substrate using a flame or other heat source.

Referring now to FIG. 4, illustrated is an embodiment of a system 400 that may be used to implement the above-described die-attach process. The system 400 includes a device 405 (e.g., a tray, chuck, clamp, etc.) for holding a substrate 410. System 400 also includes a pick-and-place machine 490. The pick-and-place machine may include a first tool 401 for holding and moving a die 420 (that is to be placed on substrate 410). Pick-and-place machine 490 may include a second tool 402 for holding and moving a heat shield 450 (that is to be placed over and/or around the die 420 during die attach). The heat shield 450 includes an aperture 455 that is sized and oriented to receive the die 420. The pick-and-place machine 490 may further include a third tool 403 for moving and/or supplying a flame source 470 (or other heat source).

In operation, the pick-and-place machine 490 may position the die 420 on substrate 410, and this machine may also position the heat shield 450 over and/or around the die 420. Either the die 420 or heat shield 450 may first be placed over the substrate 410, and the aperture 455 in heat shield 450 may function to align the die 420 on the substrate. The flame source 470 is also positioned by pick-and-place machine 490 at the desired position relative to the die and substrate. The pick-and-place machine may further be used to place the substrate 410 on holding device 405. With the substrate 410, die 420, heat shield 450, and heat source 470 appropriately positioned, attachment of the die 420 to substrate 410 may be performed using a flame produced by source 470, as described above (see FIGS. 1-3 and the accompanying text).

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. A method comprising applying a flame to one side of a die to reflow a number of solder leads extending between an opposing side of the die and a substrate, wherein an absorbed heat flux at the one side of the die is at least approximately 40 W/cm$^2$.

2. The method of claim 1, wherein the flame is produced by combustion of a gas.

3. The method of claim 1, wherein the flame is applied for a duration of up to approximately 2 seconds.

4. The method of claim 1, wherein the flame extends to the one side of the die.

5. The method of claim 1, wherein the flame extends to a location proximate the one side of the die.

6. The method of claim 1, further comprising placing a heat shield around the die.

7. The method of claim 1, wherein the opposing die side reaches a temperature in a range of between 225 degrees and 415 degrees Celsius.

8. A method comprising:
   placing a die on a substrate, the die having a front side and an opposing back side, the die having a number of leads extending from the front side, each of the leads mating with a corresponding one of a number of lands on the substrate;
   placing a heat shield around the die; and
   applying a flame to the die back side to heat the die and bond each die lead to the corresponding one land on the substrate.

9. The method of claim 8, wherein each of the die leads comprises a solder bump.

10. The method of claim 8, wherein the flame is produced by combustion of a gas.

11. The method of claim 8, wherein the flame is applied for a duration of up to approximately 2 seconds.

12. The method of claim 8, wherein an absorbed heat flux at the die back side is at least approximately 40 W/cm$^2$.

13. The method of claim 8, wherein the flame extends to the die back side.

14. The method of claim 8, wherein the flame extends to a location proximate the die back side.

15. The method of claim 8, wherein the die front side reaches a temperature in a range of between 225 degrees and 415 degrees Celsius.

16. A system comprising:
   a device to hold a substrate;
   a heat shield to position around the a die disposed on the substrate; and
   a flame source to heat the die disposed on the substrate and reflow a number of leads extending between the die and substrate.

17. The system of claim 16, further comprising a device to place the die on the substrate.

18. The system of claim 16, wherein the flame source comprises a combustible gas.

19. The system of claim 16, further comprising a pick-and-place machine, the pick-and-place machine including a first tool to position the die on the substrate and a second tool to position the flame source relative to the die.

20. The system of claim 19, wherein the pick-and-place machine further includes a third tool having the heat shield.

21. A method comprising:
   placing a die on a substrate, the die having a front side and an opposing back side, the die having a number of leads extending from the front side, each of the leads mating with a corresponding one of a number of lands on the substrate; and applying a heat source to the die back side to heat the die and bond each die lead to the corresponding one land on the substrate, the heat source selected from a group consisting of superheated air, plasma, and steam;

wherein an absorbed heat flux at the die back side is at least approximately 40 W/cm$^2$.

22. The method of claim 21, wherein each of the die leads comprises a solder bump.

23. The method of claim 21, wherein the heat source is applied for a duration of up to approximately 2 seconds.

24. The method of claim 21, further comprising placing a heat shield around the die.

25. A method comprising:

placing a heat shield around a die; and applying a flame to one side of the die to reflow a number of solder leads extending between an opposing side of the die and a substrate, wherein the opposing side of the die reaches a temperature in a range of between 225 degrees and 415 degrees Celsius.

26. The method of claim 25, wherein the flame is produced by combustion of a gas.

27. The method of claim 25, wherein the flame extends to the one side of the die.

28. The method of claim 25, wherein the flame extends to a location proximate the one side of the die.

29. A method comprising:

placing a die on a substrate, the die having a front side and an opposing back side, the die having a number of leads extending from the front side, each of the leads mating with a corresponding one of a number of lands on the substrate; and applying a heat source to the die bask side to heat the die and bond each die lead to the corresponding one land on the substrate, the heat source selected from a group consisting of superheated air, plasma, and steam;

wherein the heat source is applied for a duration of up to approximately 2 seconds; and wherein the die front side reaches a temperature in a range between 225 degrees and 415 degrees Celsius.

30. The method of claim 29, wherein each of the die leads comprises a solder bump.

31. The method of claim 29, further comprising placing a heat shield around the die.

32. A method comprising:

placing a heat shield around a die; and applying a heat source to one side of the die to reflow a number of solder leads extending between an opposing side of the die and a substrate, the heat source selected from a group consisting of a flame, superheated air, plasma, and steam.

33. The method of claim 32, wherein the one side of the die reaches a temperature in a range of between 225 degrees and 415 degrees Celsius.

34. The method of claim 32, wherein an absorbed heat flux at the one side of the die is at least approximately 40 W/cm$^2$.

35. The method of claim 32, wherein the heat source is applied for a duration of up to approximately 2 seconds.

36. A system comprising:

a device to hold a substrate;

a heat shield to position around the a die disposed on the substrate; and a heat source to heat the die disposed on the substrate and reflow a number of leads extending between the die and substrate, the heat source selected from a group consisting of superheated air, plasma, and steam.

37. The system of claim 36, further comprising a pick-and-place machine, the pick-and-place machine including a first tool to position the die on the substrate.

38. The system of claim 37, wherein the pick-and-place machine includes a second tool to position the heat source relative to the die.

39. The system of claim 38, wherein the pick-and-place machine further includes a third tool including the heat shield.

* * * * *